(12) United States Patent

Todorov et al.

(10) Patent No.: US 12,609,280 B2

(45) Date of Patent: Apr. 21, 2026

(54) SUBSTRATE STRESS MANAGEMENT USING VARIABLE ENERGY AND VARIABLE DOSE IMPLANTATION

(71) Applicant: Applied Materials, Inc., Santa Clara, CA (US)

(72) Inventors: Stanislav S. Todorov, Topsfield, MA (US); D. Jeffrey Lischer, Acton, MA (US); Wonjae Lee, Fremont, CA (US); Pradeep Subrahmanyan, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 363 days.

(21) Appl. No.: 18/498,970

(22) Filed: Oct. 31, 2023

(65) Prior Publication Data

US 2025/0140523 A1     May 1, 2025

(51) Int. Cl.
*H01J 37/317* (2006.01)

(52) U.S. Cl.
CPC ............................... *H01J 37/3171* (2013.01)

(58) Field of Classification Search
USPC ..................................................... 250/492.21
See application file for complete search history.

(56) References Cited

U.S. PATENT DOCUMENTS

| | | | | |
|---|---|---|---|---|
| 9,650,723 | B1* | 5/2017 | D'Evelyn | ................. C30B 9/00 |
| 2004/0200417 | A1* | 10/2004 | Hanawa | ............ H01J 37/32357 |
| 2005/0136604 | A1* | 6/2005 | Al-Bayati | ............ H10D 30/024 |
| | | | | 438/301 |
| 2016/0052789 | A1* | 2/2016 | Gaathon | ................. C01B 32/28 |
| | | | | 156/345.3 |

\* cited by examiner

*Primary Examiner* — Kiet T Nguyen

(74) *Attorney, Agent, or Firm* — KDW Firm, PLLC

(57) ABSTRACT

A method of stress management in a substrate. The method may include comprising providing a stress compensation layer on a main surface of the substrate; and performing a dynamic implant procedure in an ion implanter to implant a set of ions into the stress compensation layer. The dynamic implant procedure may include exposing the substrate to an ion beam under a first set of conditions, the first set of conditions comprising an ion energy, a beam scan rate and a substrate scan rate; and varying at least the ion energy while the substrate is exposed to the ion beam. As such, a stress state of the substrate may change as a function of location on the substrate as a result of the dynamic implant.

20 Claims, 7 Drawing Sheets

1000

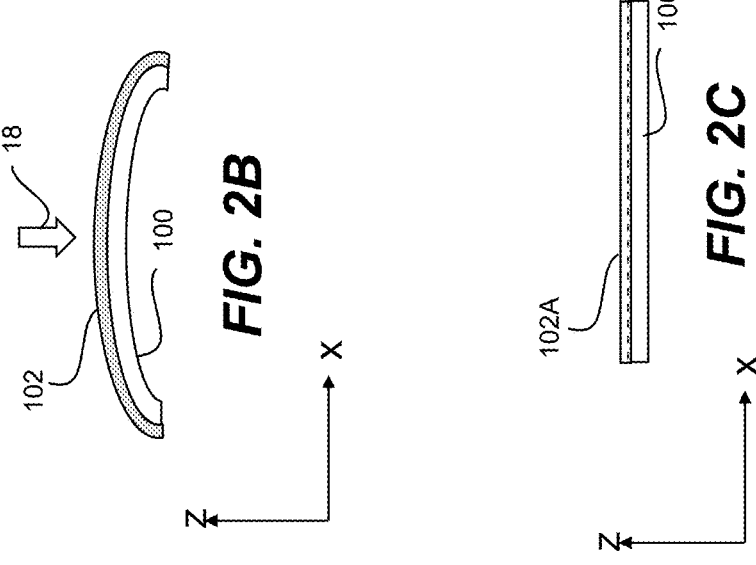
*FIG. 2A*
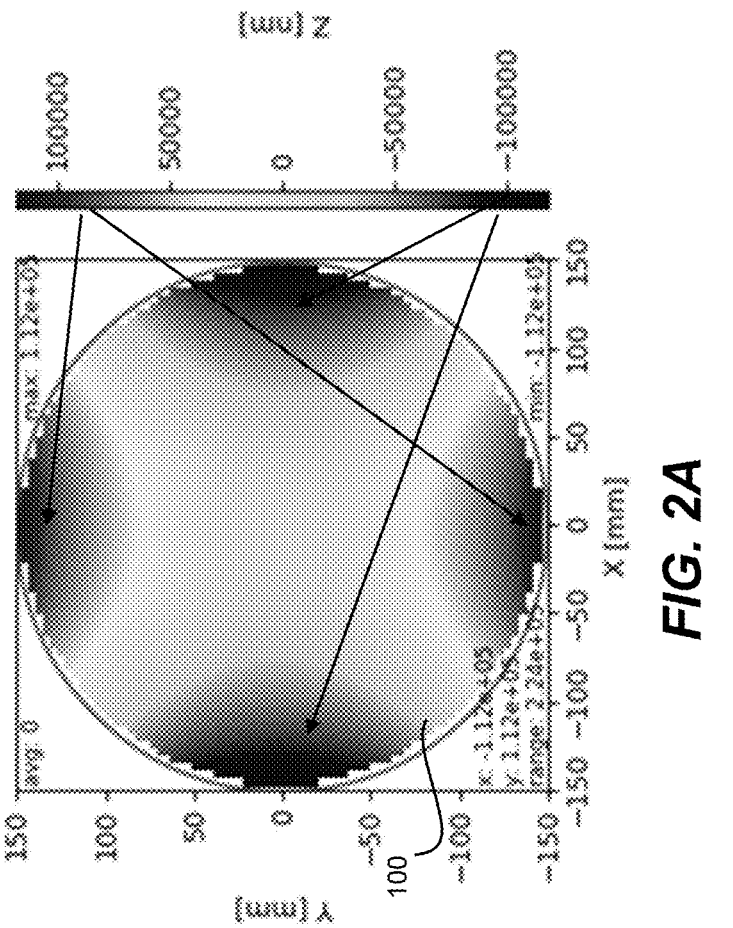
*FIG. 2B*
*FIG. 2C*

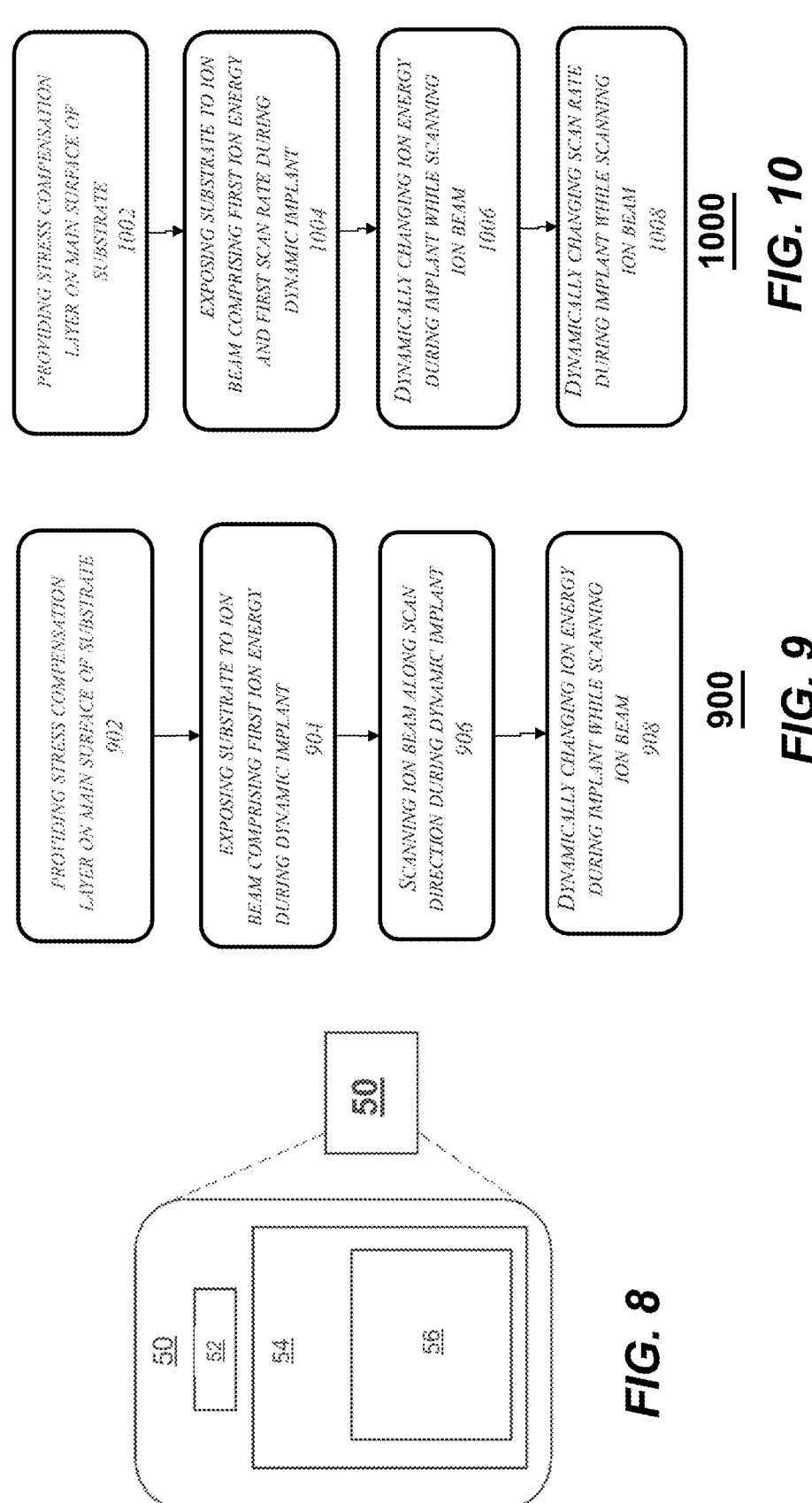

PROVIDING STRESS COMPENSATION LAYER ON MAIN SURFACE OF SUBSTRATE
1002

EXPOSING SUBSTRATE TO ION BEAM COMPRISING FIRST ION ENERGY AND FIRST SCAN RATE DURING DYNAMIC IMPLANT
1004

DYNAMICALLY CHANGING ION ENERGY DURING IMPLANT WHILE SCANNING ION BEAM
1006

DYNAMICALLY CHANGING SCAN RATE DURING IMPLANT WHILE SCANNING ION BEAM
1008

PROVIDING STRESS COMPENSATION LAYER ON MAIN SURFACE OF SUBSTRATE
902

EXPOSING SUBSTRATE TO ION BEAM COMPRISING FIRST ION ENERGY DURING DYNAMIC IMPLANT
904

SCANNING ION BEAM ALONG SCAN DIRECTION DURING DYNAMIC IMPLANT
906

DYNAMICALLY CHANGING ION ENERGY DURING IMPLANT WHILE SCANNING ION BEAM
908

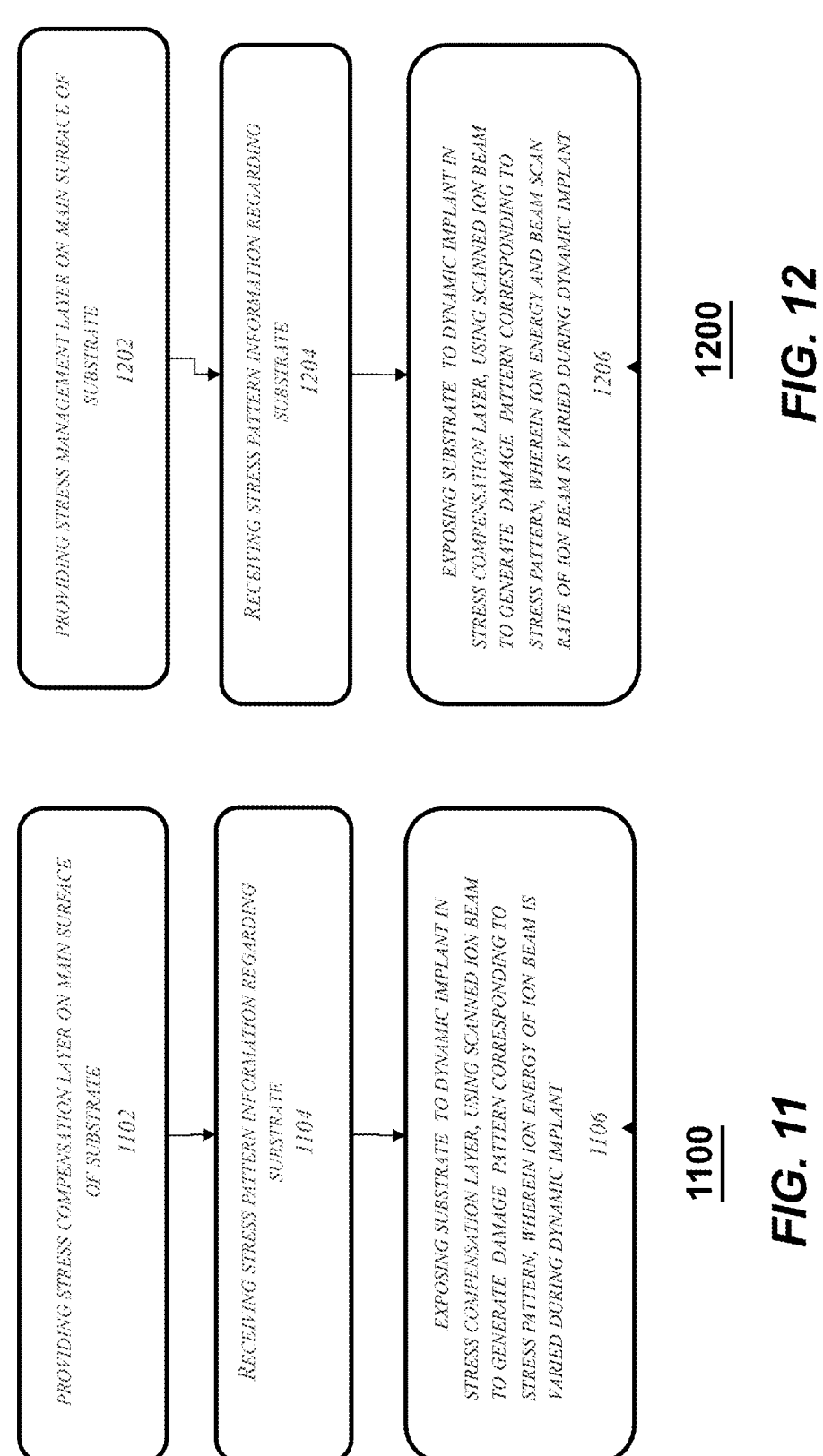

PROVIDING STRESS MANAGEMENT LAYER ON MAIN SURFACE OF SUBSTRATE
1202

RECEIVING STRESS PATTERN INFORMATION REGARDING SUBSTRATE
1204

EXPOSING SUBSTRATE TO DYNAMIC IMPLANT IN STRESS COMPENSATION LAYER, USING SCANNED ION BEAM TO GENERATE DAMAGE PATTERN CORRESPONDING TO STRESS PATTERN, WHEREIN ION ENERGY AND BEAM SCAN RATE OF ION BEAM IS VARIED DURING DYNAMIC IMPLANT
1206

PROVIDING STRESS COMPENSATION LAYER ON MAIN SURFACE OF SUBSTRATE
1102

RECEIVING STRESS PATTERN INFORMATION REGARDING SUBSTRATE
1104

EXPOSING SUBSTRATE TO DYNAMIC IMPLANT IN STRESS COMPENSATION LAYER, USING SCANNED ION BEAM TO GENERATE DAMAGE PATTERN CORRESPONDING TO STRESS PATTERN, WHEREIN ION ENERGY OF ION BEAM IS VARIED DURING DYNAMIC IMPLANT
1106

SUBSTRATE STRESS MANAGEMENT USING VARIABLE ENERGY AND VARIABLE DOSE IMPLANTATION

FIELD

The present embodiments relate to stress control in substrates, and more particularly to stress compensation to reduce out-of-plane distortion in substrates.

BACKGROUND

Devices such as integrated circuits, memory devices, and logic devices may be fabricated on a substrate such as a semiconductor wafer by a combination of deposition processes, etching, ion implantation, annealing, and other processes. Often, complete fabrication of devices and related circuitry may entail many hundreds of operations, including dozens of lithography operations. In particular, lithographic operations may require that a given mask to fabricate structures in a given region or level is to be aligned to preexisting structures.

A resulting problem with fabrication of substrates is the development of out-of-plane distortion (OPD) caused by stresses within the wafer, which distortion may be referred to as warpage. This OPD may be a result of stress that develops within the wafer as a result of processing. For example, a constant stress in a film stack on a wafer (substrate) will lead to a paraboloid shape of the wafer. This paraboloid shape can pose challenges to handling the wafer during downstream processing, but has no effect on device overlay. However, patterning of these film stacks results in variations of the stress across the wafer, meaning along the main surface of the wafer, and leads to OPD shapes that are more complicated than a simple paraboloid. One can subtract the best-fit paraboloid of the OPD to obtain what are called OPD residuals. Management of these OPD residuals may be critical to achieve proper overlay between structures fabricated at different levels of a device. For example, a type of OPD often encountered is a global wafer curvature that may develop at many instances of processing due to stress buildup in the wafer as a result of processing operations.

One approach to managing wafer (substrate) stress is to provide a stress compensation layer on the back side of a substrate, which layer may be used counteract existing stress within the substrate and thus reduce OPD. In particular implementations, ion implantation has been used to implant ions into the stress compensation layer in order to attempt to alter the stress state locally in the strain compensation layer and thus indirectly change the stress and OPD in the substrate. In some approaches, the amount of ions implanted into different regions of a substrate may be varied to account for local stress differences across the plane of the wafer.

However, ion implantation inherently generates non-uniformity within the thickness of an implanted layer such as a stress compensation layer, where such non-uniformity is not taken into account in the current approaches. Thus, the current implantation approaches may not efficiently manage stress control in a substrate, including non-uniform stress management.

With respect to these and other considerations the present embodiments are provided.

BRIEF SUMMARY

In one embodiment, a method of stress management in a substrate is provided. The method may include comprising providing a stress compensation layer on a main surface of the substrate; and performing a dynamic implant procedure in an ion implanter to implant a set of ions into the stress compensation layer. The dynamic implant procedure may include exposing the substrate to an ion beam under a first set of conditions, the first set of conditions comprising an ion energy, a beam scan rate and a substrate scan rate; and varying at least the ion energy while the substrate is exposed to the ion beam. As such, a stress state of the substrate may change as a function of location on the substrate as a result of the dynamic implant.

In another embodiment, an ion implanter is provided. The ion implanter may include an ion source to generate an ion beam, an acceleration component to vary an ion energy of the ion beam, a scanner to implement a scanning the ion beam, and a controller. The controller may include a processor; and a memory unit coupled to the processor, including a dynamic implant routine, the dynamic implant routine operative on the processor to control the acceleration component to impart a damage pattern into a substrate by varying the ion energy during the scanning of the ion beam across a main surface of the substrate.

In a further embodiment, a controller for an implanter is provided. The controller may include a processor, and a memory unit coupled to the processor, including a dynamic implant routine, the dynamic implant routine operative on the processor to control an acceleration component of the ion implanter to impart a damage pattern into a substrate by varying an ion energy of an ion beam during a scanning of the ion beam across a main surface of the substrate.

BRIEF DESCRIPTION OF THE DRAWING

FIG. 2A there is shown an example of a stress state in a substrate;

FIG. 2B shows the geometry for managing stress in a substrate, according to embodiments of the disclosure;

FIG. 2C shows an example of a substrate shape as the result of ion implantation to properly compensate for an initial substrate stress as in FIG. 2B.

FIG. 8 shows further details of a controller, arranged according to various embodiments of the disclosure;

FIG. 9 depicts an exemplary process flow;

FIG. 10 depicts another exemplary process flow;

FIG. 11 depicts another exemplary process flow; and
FIG. 12 depicts a further exemplary process flow.

DETAILED DESCRIPTION

Figure 1:
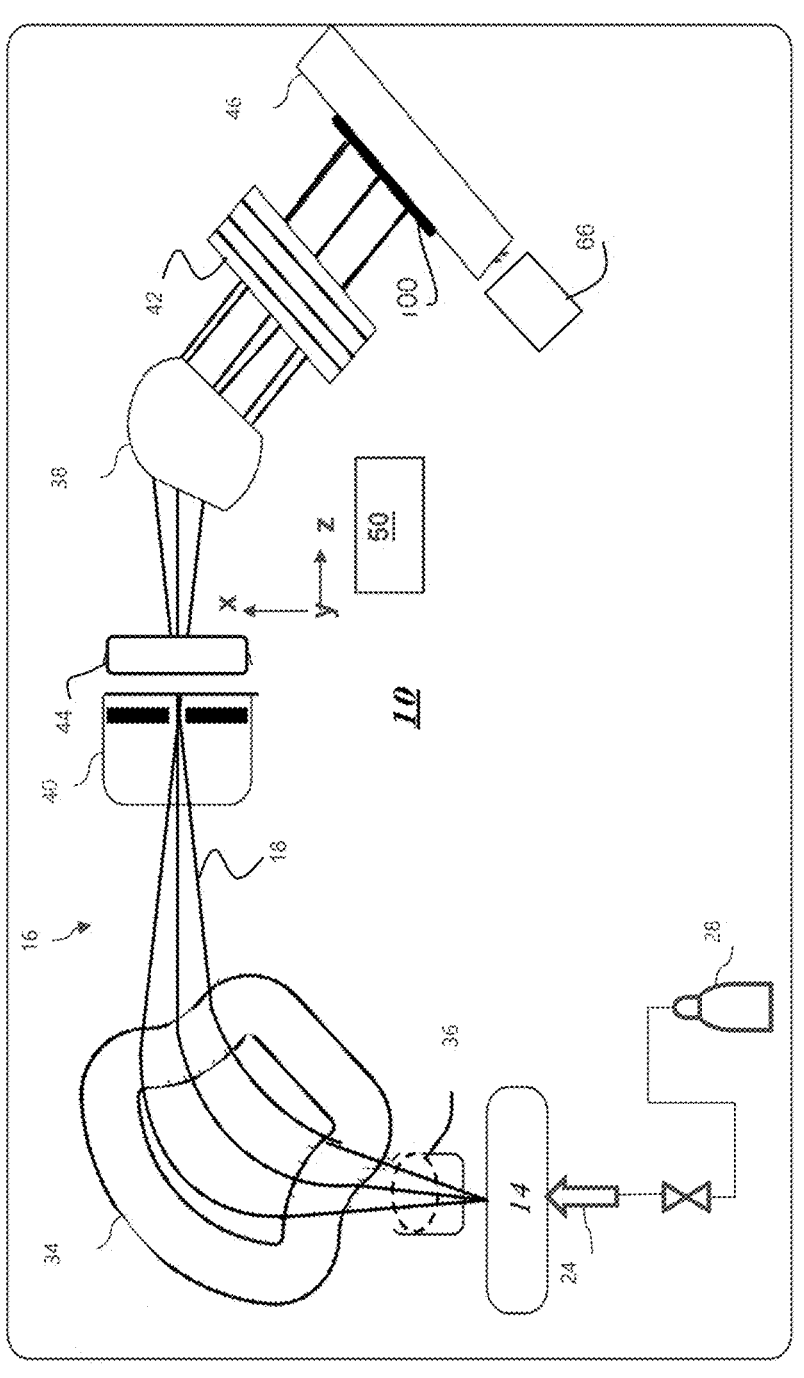
FIG. 1 depicts an exemplary system in accordance with embodiments of the present disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. Instead, these embodiments are provided so this disclosure will be thorough and complete, and will fully convey the scope of the subject matter to those skilled in the art. In the drawings, like numbers refer to like elements throughout.

The embodiments described herein relate to techniques and apparatus for improved substrate stress management. The present embodiments involve a novel set of implants into a layer provided on a substrate in order to improve stress relief in the substrate. In particular, a set of chained implants may be performed using a beamline ion implanter to optimize the distribution of damage in the implanted layer in a manner to more effectively treat substrate stress.

Referring now to FIG. 1, an exemplary system in accordance with the present disclosure is shown. The ion implantation system (hereinafter "system") 10 represents a process chamber containing, among other components, an ion source 14 for producing an ion beam 18, an ion implanter, and a series of beam-line components 16. The ion source 14 may comprise a chamber for receiving a flow of gas 24 and generating ions therein. The ion source 14 may also comprise a power source and an extraction electrode assembly disposed near the chamber. The beam-line components 16 may include, for example, a mass analyzer 34, a first acceleration or deceleration stage 36, a collimator 38, a mass resolving slit 40, and other suitable downstream beamline components such as an energy filter 42, to accelerate the ion beam 18, decelerate the ion beam 18, shape the ion beam 18, scan the ion beam 18, and so forth.

In particular embodiments, the beam-line components 16 may filter, focus, accelerate, decelerate, and otherwise manipulate ions or the ion beam 18 to have a desired species, shape, energy, and other qualities. The ion beam 18 passing through the beam-line components 16 may be directed toward a substrate 100 mounted on a platen 46 or clamp within a process chamber. As appreciated, the substrate may be moved using a control mechanism 66 in one or more dimensions (e.g., translate, including scanning, rotate, and tilt). As shown, there may be one or more feed sources 28 operable with the chamber of the ion source 14.

As an example, the ion implantation system 10 may include a scanner 44, to scan the ion beam 18. For example, the ion beam 18 may be provided as a pencil beam or spot beam that is scanned with the X-Y plane of the Cartesian coordinate system. For example, a scan generator (not separately shown) may deliver a scan signal, such as an oscillating voltage, to a pair of electrode plates that generate an oscillating electric field at a scan frequency in the kHz range, such as 1 kHz, 2 kHz, 5 kHz, according to some non-limiting embodiments.

In various embodiments, different species may be used as the ions to be used to process the stress in the film. Non-limiting examples of suitable ions include silicon (Si), boron (B), carbon (C), oxygen (O), germanium (Ge), phosphorus (P), arsenic (As), and so forth as to control substrate stress.

Although non-limiting, the ion source 14 may include a power generator, plasma exciter, plasma chamber, and the plasma itself. The plasma source may be an inductively-coupled plasma (ICP) source, toroidal coupled plasma source (TCP), capacitively coupled plasma (CCP) source, helicon source, electron cyclotron resonance (ECR) source, indirectly heated cathode (IHC) source, glow discharge source, electron beam generated ion source, or other plasma sources known to those skilled in the art.

The ion source 14 may generate the ion beam 18 for processing a substrate 100. In various embodiments, the ion beam (in cross-section) may have a targeted shape, such as a spot beam or ribbon beam, as known in the art. In the Cartesian coordinate system shown, the direction of propagation of the ion beam 18 may be represented as parallel to the Z-axis, while the actual trajectories of ions with the ion beam 18 may vary. In order to process the substrate, the ion beam 18 may be accelerated to acquire a target energy by establishing a voltage (potential) difference between the ion source 14 and the wafer (substrate).

As further shown in FIG. 1, the system 10 may include a controller 50 to control operation of various components of the system 10, including components to scan the platen 46, to tilt the platen 46, to scan the ion beam 18, or to adjust the energy of the ion beam 18, for example. Operation of the controller is further detailed with respect to FIG. 8 to follow.

In various embodiments detailed herein a beamline ion implanter is used to perform an implant into a stress compensation layer (SCL) on a substrate, where parameter(s) such as the ion energy or dose may be dynamically varied during implantation, in order to adjust the stress state in a substrate. Turning to FIG. 2A there is shown an example of a stress state in a substrate. This state of stress is accompanied by a resulting state of strain (or OPD when the strain is primarily due to bending of the wafer) on the wafer with the stress and strain related by Hooke's law. In this example, the strain state may be represented by a pattern of OPD. In the example of FIG. 2A the OPD has a symmetrical configuration where a negative OPD is seen in vertical football shaped regions to the left and right periphery of the substrate 100, and a positive OPD is observed in horizontal football shaped regions to the upper and lower periphery of the substrate 100. The example stress pattern of FIG. 2A is provided for the purposes of illustration, while in general the substrate 100 may be characterized by simpler stress patterns, or by more complex stress patterns.

Turning to FIG. 2B there is shown the geometry for managing stress in a substrate 100, according to embodiments of the disclosure. In this example, the ion beam 18 is directed to the substrate 100, and in particular to the stress compensation layer, shown as a layer 102, disposed on a main surface of the substrate 100. The layer 102 may be an oxide layer or a nitride layer according to some non-limiting embodiments, such as silicon nitride (hereinafter referred to also as "SiN"). The layer 102 may be deposited on the substrate so as to act as a medium to receive an implant dose of ions, so as to change the stress state in the layer 102, and thus to change the stress state in the substrate 100. As illustrated in FIG. 2B, the substrate may exhibit curvature in the X-Z plane of the Cartesian coordinate system shown, leading to OPD. The curvature shown in FIG. 2B may be global, as well as local, and may extend in a two-dimensional pattern as shown in FIG. 2A. As an example, the substrate 100 may include device structures to be fabricated, or in the process of being fabricated on the substrate 100, where these devices are located on the main surface of the substrate 100, opposite to layer 102. As such, one goal may be to reduce curvature of the substrate 100, thus reducing OPD and aiding in device processing.

According to embodiments of the disclosure, the ion beam 18 may be directed to the layer 102 in a dynamic implant that reduces the stress within the substrate 100. The dynamic implant may be performed in a manner to more efficiently distribute damage within the layer 102, both in the Z-direction over the thickness of the layer 102, and over the X-Y plane, and thus more precisely control the stress. In accordance with the present embodiments a dynamic implant may entail varying one or more implant parameters during a given implant process, while a substrate is exposed to an ion beam. Examples of a dynamic implant include implanting a substrate while varying ion energy, implanting a substrate while varying ion dose, implanting a substrate while varying both ion energy and ion dose. In particular, in a dynamic implant, the given parameter(s) of the ion implanter may be varied as a function of beam location with respect to a surface of the substrate. Thus, a dynamic implant according to various embodiments of the disclosure may be implemented in an ion implanter that employs a scanned ion beam, a scanned substrate, or both a scanned ion beam and scanned substrate, where the relative position of the ion beam is scanned with respect to an X-Y plane of a substrate platen that supports the substrate.

In particular embodiments, the layer 102 may be deliberately formed in a relatively higher stress state, which stress state will impart a relatively greater curvature into the substrate 100. In so doing, the changes is the stress state of layer 102 and therefore changes in curvature of the substrate 100 may be enhanced for a given set of ion implantation conditions, discussed below. An example of a properly treated state of the substrate 100 is shown in FIG. 2C, where the substrate 100 is depicted as flat, which shape may be the result of ion implantation into layer 102 to properly compensate for initial substrate stress illustrated in FIG. 2B.

Figure 3B:
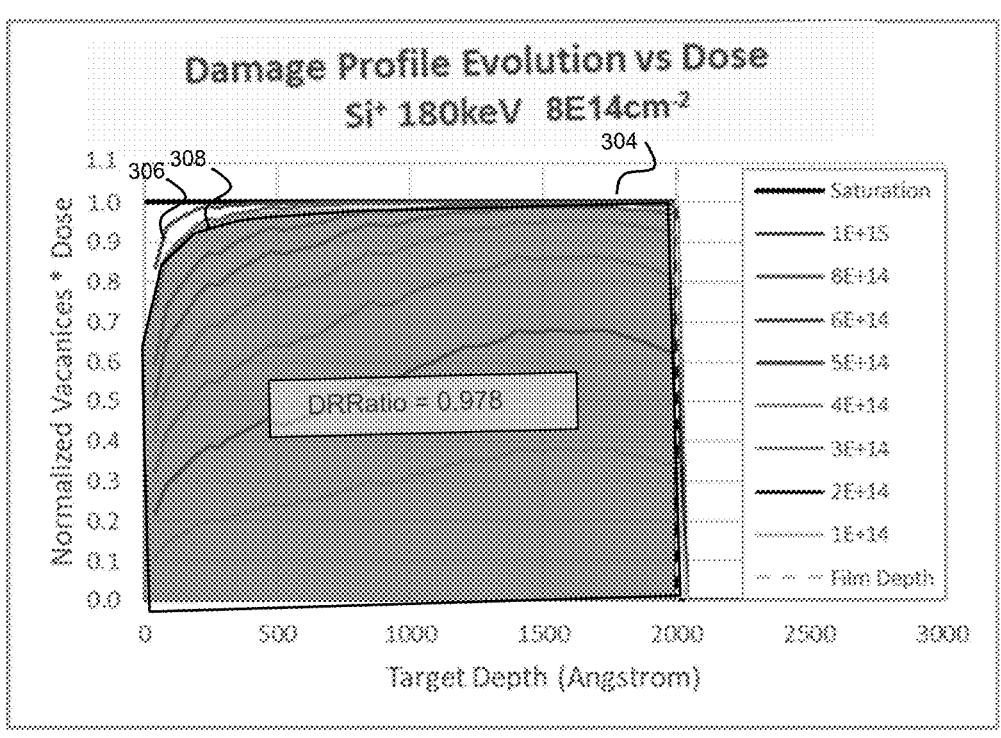
FIG. 3B is a graph that plots the same series of curves as FIG. 3A, highlighting dose profiles and another stress response ratio (SRR) for another given total dose of ions.
Figure 3A:
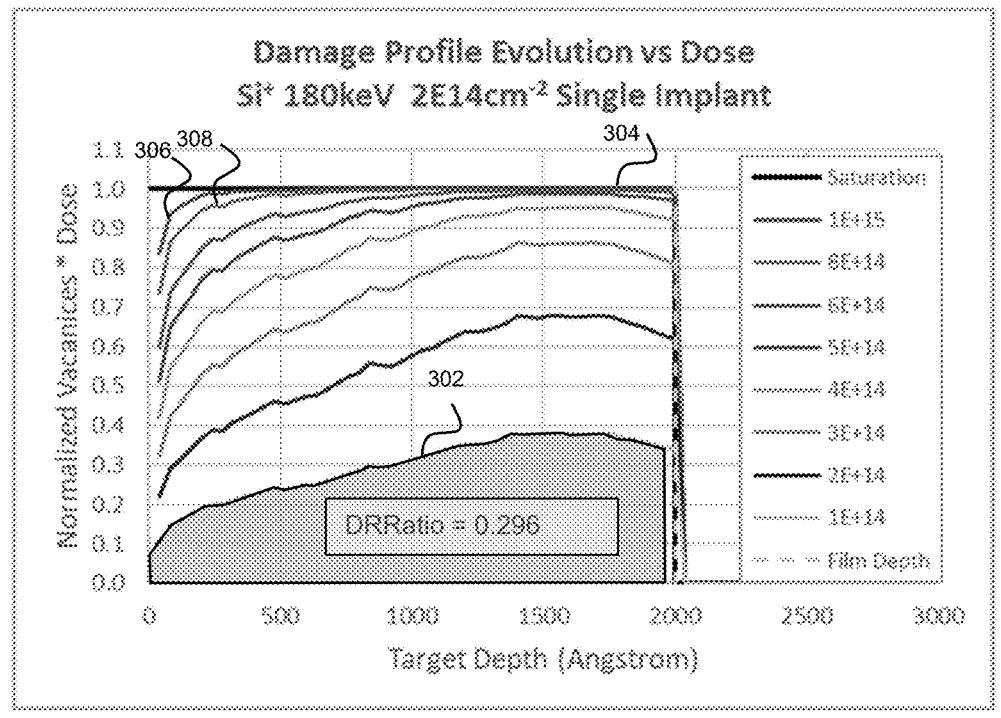
FIG. 3A is a graph that illustrates the use of ion implantation to achieve defect saturation using a single implant approach, highlighting a stress response ratio (SRR) for a given total dose of ions.
Figure 4:
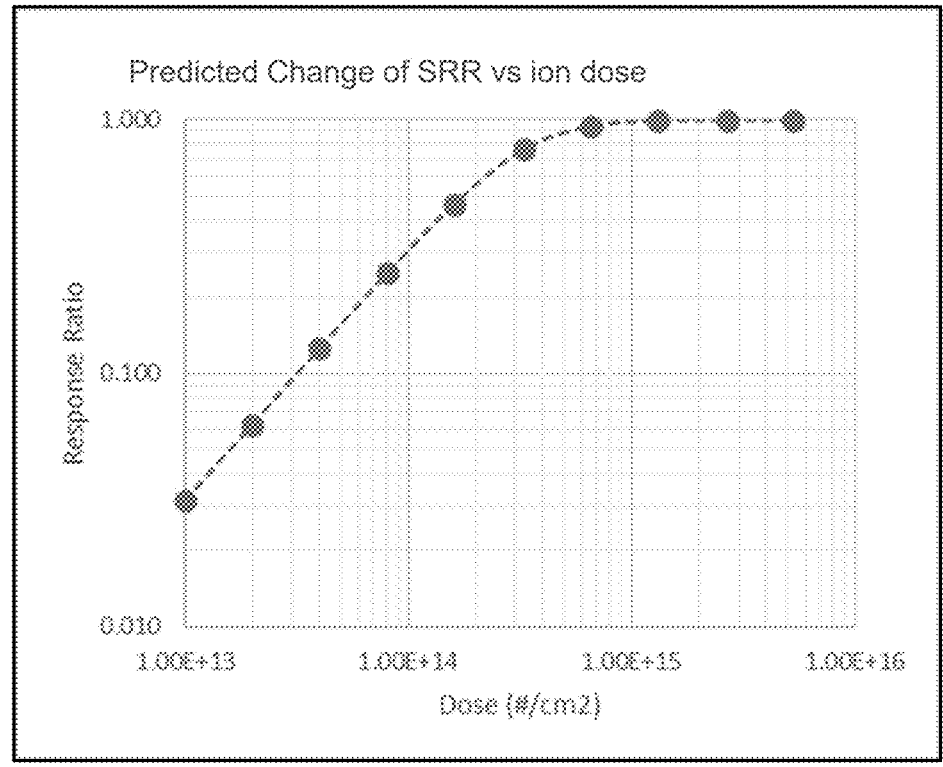
FIG. 4. Shows the variation of SRR as a function of ion dose for 180 keV Si ions.

FIG. 3A is a graph that illustrates the use of ion implantation to achieve defect saturation using a single implant approach. In particular, the graph plots the normalized vacancies generated by Si ion implantation as a function of depth within a 2000 Å thick SiN layer. The ion energy of the single implant is 180 keV, and a series of curves are shown representing the dose profiles that exist after a given total dose of Si ions has been implanted into the SiN layer. The lowest curve represents a total dose of $1E14/cm^2$, while the highest curve represents a total dose of $1E15/cm^2$. The series of curves thus represent the evolution of a damage profile as a function of total dose. Note that at relatively lower total dose, the damage saturates for relatively greater depths within the SiN. For example, using a normalized vacancy value of 0.9 as a threshold for very saturated defect level, this value is exceeded at depths greater than 700 Å for a dose of $5E14/cm^2$. However, higher dose levels just slowly increase the normalized vacancy value at depths greater than 700 Å, while gradually increasing the normalized vacancy value at shallower depths. In sum, the single-implant results shown in FIG. 4 depict a saturation behavior of net defect creation that is first exhibited at the wafer region(s) subjected to the harshest ion bombardment.

In the example of FIG. 3A, the shaded area under the lowest curve, curve 302, (generated by $1E14/cm^2$ ion dose at 180 keV) represents a quantity that is used to determine a stress response ratio (SRR) for the SiN film when subject to a given ion implantation. The stress response ratio provides an indication of the relative changes in stress state in a layer that are induced by a given exposure to ions. A relatively higher stress response ratio will indicate that a relatively larger change in stress condition of an implanted layer will occur in response to the implanting ions. In particular, the term "stress response ratio" may refer to the change in stress state of a film after a particular amount of ion exposure. According to various embodiments of the disclosure, the stress response ratio may be expressed in terms of changes in ion dose at a given energy, changes in ion energy at a given dose, and so forth.

The stress response ratio may be quantified in one approach by determining stress response to a given implant $(S_I)$ compared to a maximum theoretical stress response for the stress compensation layer $(S_M)$. The determination of maximum theoretical stress response may be derived by determining of an integrated damage level that results in a maximum stress response. In particular embodiments, the value of SRR may be determined by determining the integrated damage in an SCL that is generated by a given implant in relation to a maximum integrated damage threshold, beyond which damage threshold further damage does not alter a stress state in the SCL.

In FIG. 3A, the damage induced in an SCI is expressed as normalized vacancies as noted, where the value of normalized vacancies by definition does not exceed 1. The present inventors have appreciated that ion beam bombardment of a stress management layer produces collision cascades within the stress management layer, which cascades enable the relocation of layer atoms from an initial higher energy position, to energetically more stable positions, thus lowering the wafer stress. The present inventors have also realized that beyond a certain damage threshold, such as an integrated damage threshold over a thickness of an SCL, any further damage introduced into the SCL will not further alter the stress state of the SCL. Thus, the area under the curve for the upper horizontal line, curve 304, may be deemed to represent $S_M$, which entity is the maximum theoretical stress response that the SCL may exhibit in response to implantation. In this case, the SCL is a 2000 Å thick SiN layer subject to an implant of $Si^+$ ions having an ion energy of 180 keV. The area under the lowest curve, curve 302, thus represents the value of $S_I$ generated by implantation of $1E14/cm^2$ Si ion dose at 180 keV into a 2000 Å SiN layer. The ratio of $S_I/S_M$ in this case, meaning the stress response ratio, is 0.296.

Note that at a given location within the X-Y plane of the substrate of FIG. 3A, a higher or lower value of SRR may be appropriate in order to reduce the stress at that location, which value will depend upon the initial stress state of the stress management layer at the given location.

FIG. 3B is a graph that plots the same series of curves as FIG. 3A, representing the dose profiles that exist after a given total dose of Si ions has been implanted into the stress compensation layer (SCL). Again, the lowest curve, curve 302, represents a total dose of $1E14/cm^2$, while the highest curve, curve 306, represents a total dose of $1E15/cm^2$. In this graph, the shaded area is shown for the area under the curve 308 representing an implanted dose of $8E14/cm^2$ silicon ions into the SCL. At this value of ion dose, the value of SRR has increased to 0.978, meaning that the damage induced within the SCL is nearing the damage threshold corresponding to $S_M$, where further damage does not induce further changes in stress. Thus, the value of SRR increases at least over the range of $1E14/cm^2$ to $8E14/cm^2$ silicon ion dose. The variation of SRR as a function of ion dose for 180 keV Si ions is shown in FIG. 4. As shown, the variation is somewhat linear over the dose range of $1E14/cm^2$ to $8E14/cm^2$ while SRR increases less rapidly with dose at higher dose values, asymptotically approaching 1 above $1E15/cm^2$.

In some implementations, in order to vary SRR as a function of location in the X-Y plane of a substrate, a non-uniform-dose implant may be generated by scanning an ion beam having a designed ion energy across a substrate, while locally slowing down or speeding up the ion beam scan speed that is generated by a beam scanner. This non-uniform beam scanning generated by a local change in ion beam scan speed will effectively impart a different total dose into the substrate at different locations in the X-Y plane. In some implementations, the scanning of the ion beam across a substrate may be performed along the X-direction, while the substrate is scanned along the Y-direction, in order to generate a 2-dimensional ion dose pattern that represents a non-uniform ion dose imparted into the substrate across the X-Y plane.

Moreover, as detailed further below, ion energy of an ion beam may be varied as an ion beam is scanned over a substrate, either at uniform speed or non-uniformly, in order to locally vary the ion energy of ions implanting into a substrate as a function of substrate location, and thus to locally vary the SRR in the implanted layer.

Figure 5:
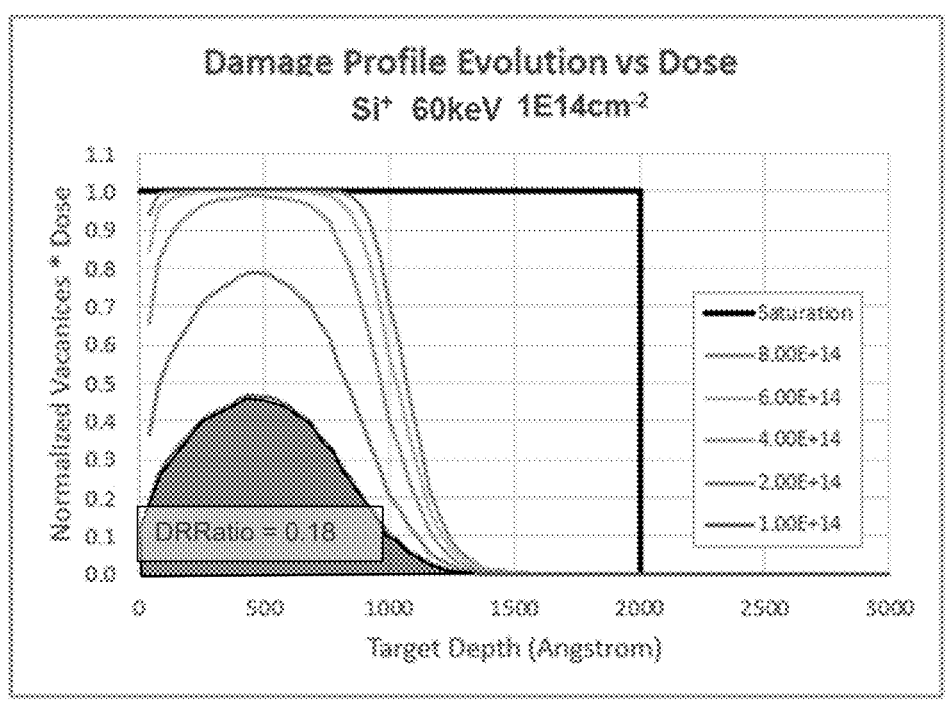
FIG. 5 is a graph that illustrates the use of ion implantation to achieve defect saturation using a single implant approach at an ion energy of 60 keV.

FIG. 5 is a graph that illustrates the use of ion implantation to achieve defect saturation using a single implant approach at an ion energy of 60 keV. In particular, as with FIG. 3A and FIG. 3B, the graph plots the distribution of the normalized vacancies generated by Si ion implantation as a function of depth within a 2000 Å thick SiN layer. The series of curves are shown representing the dose profiles that exist after a given total dose of Si ions has been implanted into the SiN layer. The lowest curve represents a total dose of $1E14/cm^2$, while the highest curve represents a total dose of $8E14/cm^2$. In comparison to the results of 180 keV Si ion implantation, shown in FIG. 3A, for example, the placement of induced damage (normalized vacancies) is much shallower, with most of the vacancies generated at depths less than 1000 Å from the surface. Given a 2000 Å thick SiN layer, as illustrated in FIG. 5, the shaded area representing the SRR value for $1E14/cm^2$ Si ion dose is just 0.18, as compared to a value of 0.296 generated at 180 keV (see FIG. 3A). The use of a relatively higher-energy ion beam (180 keV) is thus more efficient in creating vacancies and does so across a greater range of depths within a 2000 Å thick SiN layer. On the other hand, the results of FIG. 5 suggest that for a 1000 Å thick SiN layer, the use of 60 keV Si ions will be more efficient in vacancy generation, given the peak concentration of vacancy concentration at 500 Å below the upper surface of the SiN layer. Said differently, the results of FIG. 3A suggest that at 180 keV Si⁺ a large fraction of damage would be generated in the substrate that lies underneath the SiN layer, were the SiN layer to be just 1000 Å thick, thus rendering such an implant less efficient at generating vacancies in the thinner SiN layer, as compared to using 60 keV Si⁺ ions.

Figure 6:
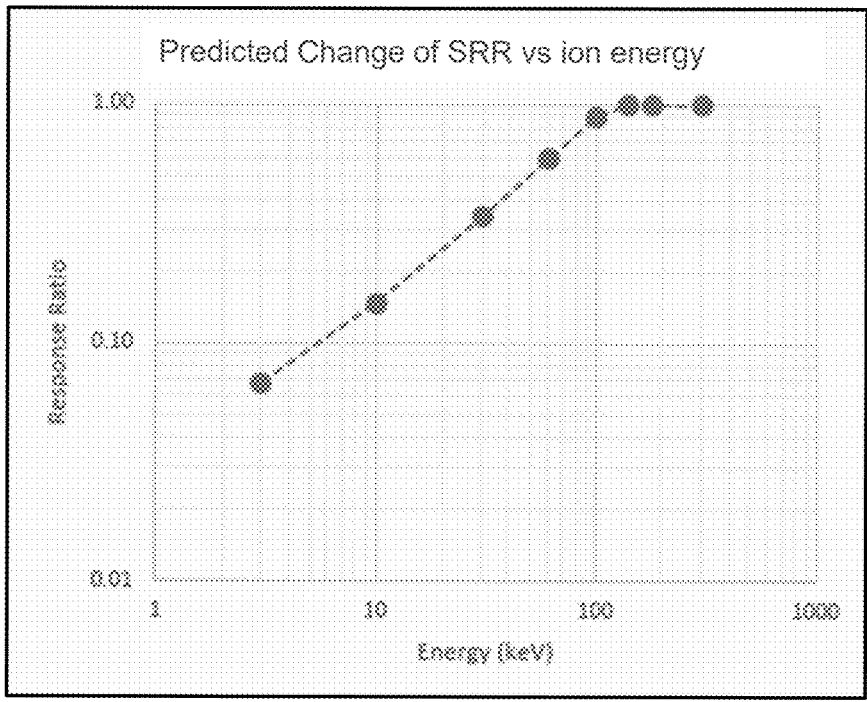
FIG. 6 is a graph showing the simulation of variation of SRR as a function of ion energy is shown in for 8E14/cm$^2$ ion dose.

The simulation of variation SRR as a function of ion energy is shown in FIG. 6 for $8E14/cm^2$ ion dose. The SRR may be determined as described above by determining a ratio of the stress response for a given implant to the maximum stress response possible for a given SCL.

Analogous to the behavior of FIG. 4, the SRR increases and saturates at higher energy values, asymptotically approaching 1 above 100 keV. One difference is that the SRR starts to decrease as the energy increases to levels above 200 keV. Above this energy, as ion energy is increased, an increasing large fraction of the incident Si ions will completely pass through the SiN stress compensation layer, creating little damage within the SiN layer along the way.

Harnessing the results of FIG. 6, in accordance with various embodiments of the disclosure, in order to vary SRR as a function of location in the X-Y plane of a substrate, a non-uniform implant may be generated by scanning an ion beam across a substrate, while dynamically varying the ion energy locally as the ion beam is scanned. This dynamic variation of ion energy during beam scanning will effectively impart a different value of SRR into the substrate at different locations in the X-Y plane, even while the ion beam scanning speed may be maintained constant. In other words, the ion dose may be imparted in a uniform manner across the X-Y plane of the substrate, by uniform beam scanning and/or uniform substrate scanning, while varying ion energy as a function of beam location. Note that dynamic variation of beam energy may be readily accomplished using known beamline components, including by real-time variation of voltages applied to an acceleration or deceleration stage 36.

In accordance with further embodiments of the disclosure, a dynamic implant may be conducted that employs both dynamic variation of ion energy as well as dynamic variation of beam scan speed. Note that dynamic variation of ion dose to vary the SRR as a function of position on a substrate surface may be accomplished by varying the settings in a first set of beamline components, such as a beam scanner or substrate scanner, while the dynamic variation of ion energy as a function of position may be accomplished by varying different components, such as an accel/decel column. Because these components are independently controllable from one another, dynamic variation of SRR as a function of position may be readily accomplished in a beamline ion implanter using a combination of ion dose variation and ion energy variation. In accordance with further embodiments of the disclosure, when dose variation and ion energy variation are applied simultaneously, the combined effect may equal to product of the individual effect on stress response ratio generated by changing ion dose, and the individual effect on stress response ratio engendered by changing ion energy. Moreover, the proper mix of dose-induced non-uniformity and energy-induced non-uniformity may be optimized for most-efficient utilization of the implanted ions. Additional parameters, including choice of implanting ion, stress management layer composition, thickness and density may also be specified in order to account for and achieve the desired change in stress across a substrate.

Note that the use of combined dynamic ion dose and energy variation may extend the range of controllable stress that is readily accessible using ion implantation of a stress management layer. In particular, it may be expected that, for certain ion beam choices, hardware and/or process capability considerations will limit the applicable ranges for certain ion beam characteristics. Said differently, for a given implantation procedure, the beamline components that are readily used to vary ion dose may be variable over a given range that defines the maximum range for varying the ion dose within a given wafer being processed. Other components, used to vary ion energy, may be capable of varying ion energy over a given energy range. The variation of these two different parameters, ion dose and ion energy, may be controlled in a manner that extends the range of SRR variation.

Figure 7:
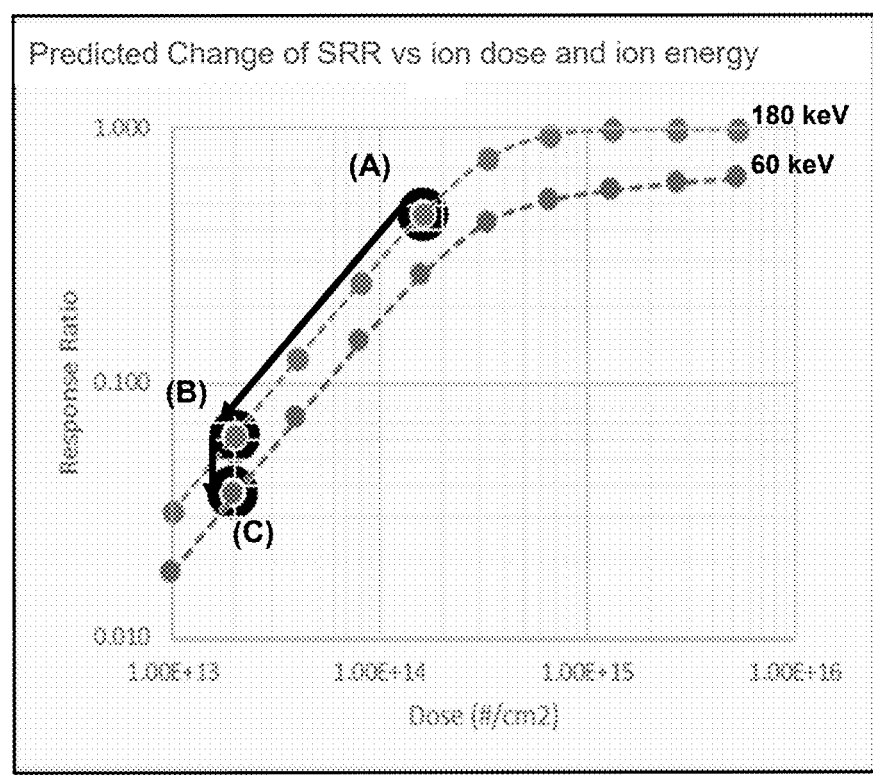
FIG. 7 provides a graph plotting SRR as a function of ion dose and ion energy for the Si$^+$/2000 Å SiN layer system.

The above scenario is illustrated in FIG. 7, which figure provides a graph plotting SRR as a function of ion dose and ion energy for the Si⁺/2000 Å SiN layer system. In FIG. 7, two curves are shown, representing a constant implant energy of 180 keV (upper curve) and a constant energy of 60 keV (lower curve). Assume that the nominal dose to be implanted into the stress management layer (e.g., SiN) is 2E14 cm$^{-2}$, which dose may be imparted at a slowest beam scan speed for example. This condition is represented by the point A on the graph, for example. Thus, the dose of 2E14 cm$^{-2}$ may represent the maximum dose that is received by a substrate at any position on the wafer. Assume also that H/W capability limits the maximum within-wafer dose range capability to 8:1, which capability, under these conditions, translates to the minimum dose that may be received by the substrate being equal to 2.5E13 cm$^{-2}$. Thus minimum dose may correspond to the dose received at the fastest accessible beam scan speed. From the curves in FIG. 7, one can extract the stress response ratios, obtained at the maximum and minimum doses, 2E14 cm$^{-2}$ and 2.5E13 cm$^{-2}$ (0.35 and 0.07, respectively). The upper (180 keV) curve of FIG. 7, yield, a SRR value of 0.35 at the maximum dose, while at the minimum dose, the SRR value of 0.07 (Point B). Thus, the possible range of variation of the SRR stress response ratio (stress response ratio range) is just 0.35/0.07 or 5:1.

In addition to varying ion dose to vary SRR, ion energy may also be varied to change SRR as further illustrated in FIG. 7. In this case, at the lowest ion dose (2.5E13 cm$^{-2}$), the SRR for 60 keV (point C) is 0.035. Thus, decreasing ion energy from 180 keV to 60 keV will vary the SRR by a ratio given by 0.07/0.035 or 2:1. From the above results, the addressable real-time damage modulation ratio may be determined, meaning the maximum change in SRR that is readily achievable by dynamic variation of beamline parameters during a given implant. The addressable real-time damage modulation ratio is simply the product of 2:1×5:1, or 10:1. In processing of wafers that exhibit a non-uniform stress state, a given maximum variation in SRR may be called for across the X-Y plane of the substrate, to account for large variations in initial stress state as a function of X-Y position of the substrate. In the example of FIG. 7, dynamic variation of ion energy over a range of 60 keV to 180 keV will afford the ability to generate SRR variation spanning a factor of 2. Likewise, dynamic variation of ion dose over a range of 2E14 cm$^{-2}$ to 2.5E13 cm$^{-2}$ will afford the ability to generate SRR variation spanning a factor of 5. When combined during a dynamic implant, dynamic variation of ion energy over a range of 60 keV to 180 keV and dynamic variation of ion dose over a range of 2E14 cm$^{-2}$ to 2.5E13 cm$^{-2}$ will afford the ability to locally vary SRR across the substrate by a factor of 10, meaning the stress response ratio range is 10. Thus, the use of both dynamic dose modulation and dynamic energy modulation may be called for under scenarios where SRR should be varied by more than a factor of 5.

In various embodiments, before implementing a dynamic implant into a substrate, a set of stress pattern information may be received at an implanter to determine the settings for the dynamic implant. The stress pattern information may include, for example, the material specifications for a stress management layer, including layer thickness, composition, and so forth. The stress pattern information may include a measured or calculated stress pattern on the substrate to be implanted, which pattern may be expressed for example, as out-of-plane distortion, local substrate curvature, or other suitable parameter. The parameters for a dynamic implant may then be determined accordingly, including dynamic changes of beam scan rate, ion energy, etc., as a function of position on the substrate. In particular, based upon the stress pattern of the substrate before implantation, a corresponding SRR pattern may be calculated, corresponding to the value of SRR to be imparted into the stress compensation layer as a function of X-Y location on the substrate. Note that for a given ion/stress compensation layer combination, SRR values may be conveniently calculated using known approaches, and may be pre-stored for a matrix of suitable ion energies, ion doses, layer thicknesses, etc., that may be applicable during a dynamic implant.

FIG. 8 shows further details of the controller 50. In this embodiment, the controller 50 may include a processor 52, such as a known type of microprocessor, dedicated processor chip, general purpose processor chip, or similar device. The controller 50 may further include a memory or memory unit 54, coupled to the processor 52, where the memory unit 54 contains a dynamic implant routine 56. The dynamic implant routine 56 may be operative on the processor 52 to manage an implant process using the ion beam 18 and substrate 100 in order to impart a SRR pattern into a stress compensation layer, as discussed above. The memory unit 54 may comprise an article of manufacture. In one embodiment, the memory unit 54 may comprise any non-transitory computer readable medium or machine readable medium, such as an optical, magnetic or semiconductor storage. The storage medium may store various types of computer executable instructions to implement one or more of logic flows described herein. Examples of a computer readable or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The embodiments are not limited in this context.

In some implementations, the memory unit 54 may receive and/or store stress pattern information, as discussed above, for a given wafer or set of wafers. In some implementations, the memory unit may store information related to SRR values for given combinations of ion type/ion energy/ion dose/stress compensation layer/substrate, and so forth. The SRR values may be stored in any suitable format including databases, tabular form, etc., and may include be pre-stored SRR values determined for a matrix of suitable ion energies, ion doses, layer thicknesses, etc., including those values that may be applicable during a given dynamic implant. The measured or calculated pattern of stress on a wafer may then by used to determine a SRR pattern to be implemented on the wafer to compensate for the stress pattern. In some implementations, the dynamic implant routine 56 may calculate a best implant procedure to implement the SRR pattern, including a best combination of ion energy variation and scan speed variation during scanning of the wafer.

Turning to FIG. 9 there is shown a process flow 900 according to embodiments of the disclosure. At block 902, a stress compensation layer is provided on a main surface of a substrate, such as a silicon wafer. In some examples, the stress compensation layer may be provided on the substrate at any suitable stage of processing. Generally, the processing of the substrate to form semiconductor devices, for example, may take place on a second main surface, opposite the main surface that receives the stress compensation layer. In some embodiments, the stress compensation layer may be a silicon oxide or a silicon nitride layer. When the stress compensation layer is provided on the silicon surface, the stress within the silicon substrate, including the stress compensation layer, may be non-uniform across the main surface of the substrate.

At block 904, the substrate is exposed to an ion beam at a first ion energy during a dynamic implant. The dynamic implant may be designed to vary one or more ion beam properties during the dynamic implant. The dynamic implant may be designed to implant a large fraction of ions into the stress compensation layer so as to change the stress state in the stress compensation layer, and thus change a stress state in the substrate.

At block 906, the ion beam is scanned along a scan direction during the dynamic implant. The ion beam may be scanned during substantially an entirety of the dynamic implant in some cases.

At block 908, the ion energy of the ion beam is dynamically changed during the dynamic implant while the ion beam is scanned. In various embodiments, the variation of the ion energy may be coordinated with the ion beam scanning so as to vary a damage within the stress compensation layer as a function of position within the main plane of the substrate.

Turning to FIG. 10 there is shown another process flow 1000 according to embodiments of the disclosure. At block 1002, a stress compensation layer is provided on a main surface of a substrate, such as a silicon wafer.

At block 1004, the substrate is exposed to an ion beam in a dynamic implant. The ion beam may have a first ion energy and may be scanned at a first scan rate. The dynamic implant may be designed to implant a large fraction of ions into the stress compensation layer so as to change the stress state in the stress compensation layer, and thus change a stress state in the substrate.

At block 1006, the ion energy of the ion beam is dynamically changed during the dynamic implant while the ion beam is scanned. In various embodiments, the variation of the ion energy may be coordinated with the ion beam scanning so as to vary a damage within the stress compensation layer as a function of position within the main plane of the substrate.

At block 1008, the scan rate of the ion beam is dynamically changed during the dynamic implant while the ion beam is scanned. In various embodiments, the variation of the scan rate while the ion beam is scanned may be coordinated so as to vary a damage within the stress compensation layer as a function of position within the main plane of the substrate. In some embodiments, the changing of the ion energy may be coordinated with the changing of the ion beam scan rate during the dynamic implant. The variation of ion energy and scan rate may be coordinated to extend the range of damage variation in the stress compensation layer as a function of position within the main plane, according to some embodiments.

Turning to FIG. 11 there is shown another process flow 1100 according to embodiments of the disclosure. At block 1102, a stress compensation layer is provided on a main surface of a substrate, such as a silicon wafer.

At block 1104, a set of stress pattern information is received regarding the substrate. The stress pattern information may include a measured or calculated stress pattern on the substrate to be implanted, which pattern may be expressed for example, as out-of-plane distortion, local substrate curvature, or other suitable parameter. In particular, based upon the stress pattern of the substrate before implantation, a corresponding SRR pattern may be calculated, corresponding to the value of SRR to be imparted into the stress compensation layer as a function of X-Y location on the substrate. Note that for a given ion/stress compensation layer combination, SRR values may be conveniently calculated using known approaches and may be pre-stored for a matrix of suitable ion energies, ion doses, layer thicknesses, etc., that may be applicable during a dynamic implant.

At block 1106, the substrate is exposed to a dynamic implant that is directed to the stress compensation layer in particular. The dynamic implant may include the use of a scanned ion beam to generate a damage pattern within the stress compensation layer that corresponds to the stress pattern received as part of the stress pattern information. In various embodiments, the dynamic implant may involve varying of the ion energy during scanning of the ion beam so as to impart a damage pattern that mimics the stress pattern. For example, the ion energy may be varied as a function of ion beam position on the substrate surface so at to locally change the value of SRR in the stress compensation layer during scanning.

Turning to FIG. 12 there is shown another process flow 1200 according to embodiments of the disclosure. At block 1202, a stress compensation layer is provided on a main surface of a substrate, such as a silicon wafer.

At block 1204, a set of stress pattern information is received regarding the substrate, as described above.

At block 1206, the substrate is exposed to a dynamic implant that is directed to the stress compensation layer in particular. The dynamic implant may include the use of a scanned ion beam to generate a damage pattern within the stress compensation layer that corresponds to the stress pattern received as part of the stress pattern information. In various embodiments, the dynamic implant may involve varying of the ion energy and the ion beam scan rate during scanning of the ion beam so as to impart a damage pattern that mimics the stress pattern. For example, the ion energy may be varied as a function of ion beam position on the substrate surface so at to locally change the value of SRR in the stress compensation layer during scanning. The beam scan rate may additionally be varied as a function of beam position on the substrate. Furthermore, variation of the ion energy may be coordinated with variation of beam scan rate to generate the desired damage pattern. The variation of ion energy and scan rate may be coordinated to extend the range of damage variation in the stress compensation layer as a function of position within the main plane, as discussed above with respect to FIG. 7, for example. This extended range for SRR variation may be needed in one instance, where the stress pattern calls for very low SRR in one location, and a maximum value of SRR in another location on the substrate.

While the aforementioned embodiments may be employed to implant stress compensation layers that are provided on the back side of a substrate, in additional embodiments, the dynamic implantation variants as detailed herein above may be used to modify stress in a stress compensation layer provided on a front side of a substrate, where the front side of the substrate includes devices, circuits, active layers, or other components. In particular embodiments, the stress compensation layer may be provided on the front side of a substrate as a sacrificial layer, such as a hard mask that is used for patterning. An advantage of performing a dynamic implantation procedure on a frontside SCL, such as an existing sacrificial layer like a hard mask, is that the sacrificial layer may be used both for patterning as well as stress compensation.

Advantages provided by the present embodiments are multifold. As a first advantage, a wider range of stress control in a layer is provided by using a combination of dynamic changes in ion energy and ion dose in order to change the stress response over a greater range. In another advantage, ion energy may be selectively varied over different portions of a substrate during a dynamic implant in order to selectively change the stress response as a function of location on the substrate.

The present disclosure is not to be limited in scope by the specific embodiments described herein. Indeed, other various embodiments and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose, yet those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of stress management in a substrate, comprising:
   providing a stress compensation layer on a main surface of the substrate; and
   performing a dynamic implant procedure in an ion implanter to implant a set of ions into the stress compensation layer, the dynamic implant procedure comprising:
      exposing the substrate to an ion beam under a first set of conditions, the first set of conditions comprising an ion energy, a beam scan rate and a substrate scan rate; and
      varying at least the ion energy while the substrate is exposed to the ion beam,
      wherein a stress state of the substrate changes as a function of location on the substrate as a result of the dynamic implant.

2. The method of claim 1, wherein the dynamic implant comprises generating a variable value of a stress response ratio (SRR) as a function of position across the main surface of the substrate, the stress response ratio being defined as a ratio as a stress response in a stress compensation layer to a given implant ($S_I$) compared to a maximum theoretical stress response for the stress compensation layer ($S_M$), wherein $SRR = S_I/S_M$.

3. The method of claim 2, the method comprising dynamically varying the ion energy and the beam scan rate during the dynamic implant procedure.

4. The method of claim 3,
   wherein the dynamic implant procedure is characterized by a dose range capability that is defined as a range between a maximum implantable dose and a minimum implantable dose for a given scan condition,
   wherein the dose range capability defines a first stress response ratio range,
   wherein the dynamic implant procedure is characterized by an energy range, and
   wherein varying the ion energy over the energy range and the dose range generates a second stress response ratio range, greater than the first stress response ratio range.

5. The method of claim 1, wherein the stress compensation layer is provided on a front side of the substrate, the front side of the substrate including on or more of: devices, circuits, and structures to be formed into devices or circuits.

6. The method of claim 5, wherein the stress compensation layer comprises an existing sacrificial patterning layer, disposed on the front side.

7. The method of claim 1, wherein the stress compensation layer comprises a silicon nitride material.

8. The method of claim 1, wherein set of ions comprises silicon ions.

9. An ion implanter, comprising:
   an ion source to generate an ion beam;
   an acceleration component to vary an ion energy of the ion beam;
   a scanner to implement a scanning the ion beam; and
   a controller, the controller comprising:
      a processor; and
      a memory unit coupled to the processor, including a dynamic implant routine, the dynamic implant routine operative on the processor to control the acceleration component to impart a damage pattern into a substrate by varying the ion energy during the scanning of the ion beam across a main surface of the substrate.

10. The ion implanter of claim 9, wherein the dynamic implant routine is operative on the processor to direct the ion implanter to generate a variable damage in a stress compensation layer disposed on the substrate, the variable damage characterized by a variation in a value of a stress response ratio (SRR) as a function of position across the main surface of the substrate,
   wherein the stress response ratio is determined from a ratio of a stress response in the stress compensation layer to a given implant ($S_I$) compared to a maximum theoretical stress response for the stress compensation layer ($S_M$).

11. The ion implanter of claim 10, wherein the stress compensation layer is provided on a front side of the substrate, the front side of the substrate including on or more of: devices, circuits, and structures to be formed into devices or circuits.

12. The ion implanter of claim 11, wherein the stress compensation layer comprises an existing sacrificial patterning layer, disposed on the front side.

13. The ion implanter of claim 9, wherein the dynamic implant routine is operative on the processor to direct the ion implanter to dynamically vary the ion energy and a beam scan rate of the scanner during the scanning of the ion beam.

14. The ion implanter of claim 13,
   wherein the ion implanter is characterized by a dose range capability that is defined as a range between a maximum implantable dose and a minimum implantable dose for a given scan condition,
   wherein the dose range capability defines a first stress response ratio range,
   wherein the ion implanter is characterized by an energy range,
   wherein the dynamic implant routine is operative on the processor to direct the ion implanter to generate the variable damage by varying implant dose and varying ion energy
   to generate a second stress response ratio range, greater than the first stress response ratio range.

15. The ion implanter of claim 9, the dynamic implant routine operative on the processor to receive a set of stress pattern information pertaining to the substrate, the set of stress pattern information comprising at least one of: a material specifications for a stress compensation layer that is disposed on the main surface, and a stress pattern on the substrate before implementation of the dynamic implant routine.

16. The ion implanter of claim 15, dynamic implant routine operative on the processor to determine a SRR pattern to be implemented on the substrate, based upon the stress pattern.

17. The ion implanter of claim 16, the dynamic implant routine operative on the processor to calculate a combination of ion energy variation and scan speed variation during scanning of the substrate to implement the SRR pattern.

18. A controller for an ion implanter, comprising:
a processor; and
a memory unit coupled to the processor, including a dynamic implant routine, the dynamic implant routine operative on the processor to control an acceleration component of the ion implanter to impart a damage pattern into a substrate by varying an ion energy of an ion beam during a scanning of the ion beam across a main surface of the substrate.

19. The controller of claim 18, wherein the dynamic implant routine is operative on the processor to direct the ion implanter to generate a variable damage in the substrate, the variable damage characterized by a variation in a value of a stress response ratio (SRR) as a function of position across the main surface of the substrate,
wherein the stress response ratio is determined from a ratio of a stress response to a given implant ($S_I$) that is imparted into a stress compensation layer provided on the main surface, compared to a maximum theoretical stress response for the stress compensation layer ($S_M$).

20. The controller of claim 18, wherein the dynamic implant routine is operative on the processor to direct the ion implanter to dynamically vary the ion energy and a beam scan rate during the scanning of the ion beam.

* * * * *